US012689388B2

(12) United States Patent
Failer et al.

(10) Patent No.: US 12,689,388 B2
(45) Date of Patent: Jul. 21, 2026

(54) ONLINE ADAPTIVE LOSSLESS COMPRESSION WITH LOCKSTEP-TRAINED PREDICTIVE MODELS

(71) Applicant: Business Mobile AG, Kreuzlingen (CH)

(72) Inventors: Thomas Failer, Kreuzlingen (CH); Maximilian Ralph Peter von und zu Liechtenstein, Douglas (IM)

(73) Assignee: Business Mobile AG, Kreuslingen (CH)

( * ) Notice: Subject to any disclaimer, the term of this patent is extended or adjusted under 35 U.S.C. 154(b) by 0 days.

(21) Appl. No.: 19/322,859

(22) Filed: Sep. 9, 2025

(65) Prior Publication Data

US 2026/0081620 A1      Mar. 19, 2026

Related U.S. Application Data

(60) Provisional application No. 63/877,391, filed on Sep. 8, 2025.

(51) Int. Cl.
H03M 7/00 (2006.01)
H03M 7/30 (2006.01)

(52) U.S. Cl.
CPC ....... H03M 7/6011 (2013.01); H03M 7/6052 (2013.01)

(58) Field of Classification Search
CPC .... H03M 7/40; H03M 7/4062; H03M 7/3079; H03M 7/6005; H03M 7/6011;
(Continued)

(56) References Cited

U.S. PATENT DOCUMENTS 5,049,881 A      9/1991   Gibson et al.
5,579,517 A      11/1996  Reynolds et al.
(Continued)

OTHER PUBLICATIONS

Goyal, M. et al., DeepZip: Lossless Data Compression using Recurrent Neural Networks, Nov. 20, 2018, arXiv:1811.08162v1 [cs.CL].

(Continued)

*Primary Examiner* — Linh V Nguyen
(74) *Attorney, Agent, or Firm* — Quisenberry Law PLLC; C. Dale Quisenberry

(57) ABSTRACT

A method and system are disclosed for adaptive lossless data compression using a predictive model that is updated deterministically in lockstep at both encoder and decoder. An encoder generates symbol probability distributions from a frozen base model with a small set of updatable parameters, encodes input blocks via entropy coding, and applies deterministic parameter updates using the observed data. A decoder entropy-decodes the compressed bitstream, reconstructs the same blocks, and applies identical updates, thereby maintaining synchronization without transmission of model parameters. Optional features include periodic beacons for state verification and resynchronization, error-control metadata, and modality-specific tokenization. In preferred embodiments, parameter adaptation is confined to adapter modules within a largely fixed neural network, ensuring computational efficiency and reproducibility across platforms. Over time, the model specializes to the stream, reducing average coding rate while guaranteeing exact reconstruction of the original data.

20 Claims, 7 Drawing Sheets

(58) Field of Classification Search

CPC .... H03M 7/6023; H03M 7/6052; H03M 7/42; H03M 7/6058; H03M 7/70; H03M 7/00; H03M 7/005; H03M 7/28; H03M 7/30; H03M 7/3059; H03M 7/3064; H03M 7/3068; H03M 7/3084; H03M 7/3088; H03M 7/3091; H03M 7/3095; H03M 7/4006; H03M 7/4018; H03M 7/405; H03M 7/4093; H03M 7/6017; H03M 7/6035; G06N 3/0495; G06N 3/063; G06N 3/08; G06N 20/00; G06N 20/20; G06N 3/006; G06N 3/04; G06N 3/045; G06N 3/0455; G06N 3/0464; G06N 3/0475; G06N 3/084; G06N 3/088; G06N 3/126; G06N 5/046; G06N 7/01; H04N 19/91; H04N 19/117; H04N 19/13; H04N 19/167; H04N 19/196; H04N 19/30; H04N 19/395; H04N 19/46; H04N 19/463; H04N 19/523; H04N 19/61; H04N 19/625; H04N 19/82; H04N 19/86; H04N 19/89; G06F 17/153; G06F 2212/401; G06F 7/483

USPC ........................ 341/51, 65, 788, 7, 106, 107

See application file for complete search history.

(56) References Cited

U.S. PATENT DOCUMENTS

| | | | |
|---|---|---|---|
| 6,199,076 B1 | | 3/2001 | Logan et al. |
| 6,604,099 B1 | | 8/2003 | Chung et al. |
| 6,771,828 B1 | * | 8/2004 | Malvar .................. H04N 19/60 |
| | | | 382/248 |
| 7,580,585 B2 | * | 8/2009 | Malvar ................... H03M 7/40 |
| | | | 341/59 |
| 8,055,085 B2 | * | 11/2011 | Monro .................... H03M 7/30 |
| | | | 341/51 |
| 8,363,733 B2 | * | 1/2013 | Yamasaki ........... H04N 19/395 |
| | | | 375/240.27 |
| 8,810,439 B1 | * | 8/2014 | Kalevo .............. H03M 7/3079 |
| | | | 341/76 |
| 8,861,627 B2 | | 10/2014 | Voinigescu et al. |
| 9,390,358 B1 | | 7/2016 | Cheung |
| 9,735,805 B2 | * | 8/2017 | Karkkainen ........ H03M 7/3095 |
| 10,423,875 B2 | | 9/2019 | Thaler |
| 11,200,567 B2 | | 12/2021 | Jivan et al. |
| 11,512,321 B2 | | 11/2022 | Gordon-Kamm et al. |
| 2019/0320188 A1 | * | 10/2019 | Abe ..................... H04N 19/174 |
| 2021/0004677 A1 | * | 1/2021 | Menick ................ G06N 3/0475 |
| 2024/0056097 A1 | * | 2/2024 | Ransom .............. H03M 7/6052 |
| 2025/0227278 A1 | * | 7/2025 | Jhu ........................ H04N 19/82 |
| 2025/0373831 A1 | * | 12/2025 | Cricrì ................... H04N 19/124 |

OTHER PUBLICATIONS

Delétang, G. et al., Language Modeling Is Compression, Mar. 18, 2024, ICLR, arXiv.2309.10668v2 [cs.LG].

Ballé, J. et al., End-To-End Optimized Image Compression, 2017, ICLR.

Minnen, D. et al., Joint Autoregressive and Hierarchical Priors for Learned Image Compression, 32nd Conference on Neural Information Processing Systems (NIPS 2018), Montreal.

* cited by examiner start

Receive Code
1700

Entropy Decode
using Θ
1752

Reconstruct Block
1700

Deterministic
Update Θu
1782

(Optional) Verify
Beacon
1794 end

ONLINE ADAPTIVE LOSSLESS COMPRESSION WITH LOCKSTEP-TRAINED PREDICTIVE MODELS

RELATED APPLICATIONS

This application claims the benefit of U.S. Provisional Application No. 63/877,391, filed Sep. 8, 2025, the contents of which are fully incorporated herein by reference

BACKGROUND OF THE INVENTIONS

1. Field of the Inventions

The present inventions relate generally to lossless data compression and data communication. More specifically, they concerns methods and systems for compressing data streams using predictive models—such as large-scale neural networks—that are adaptively updated during encoding and decoding in lockstep. The inventions lie at the intersection of data compression technology and machine learning, aiming to provide a compressor/decompressor that can improve its performance on-the-fly and potentially replace general-purpose compression tools (for example, GZIP or 7-Zip) by leveraging advanced predictive modeling.

2. Description of the Related Art

Lossless compression of digital data is conventionally achieved through dictionary-based methods and static entropy coding techniques. General-purpose compressors such as GZIP, 7-Zip, and other DEFLATE/LZ-family tools find repeated substrings and apply fixed Huffman or arithmetic codes. These traditional approaches are effective for many scenarios but have limitations: they typically exploit only relatively short-range statistical redundancies (exact or near-exact repeats or short contexts) and do not leverage deeper semantic patterns in the data. More advanced classical compressors—such as Prediction by Partial Matching (PPM), context-tree weighting (CTW), and context-mixing algorithms like PAQ—improve compression by adaptively learning symbol probabilities from context frequencies as data streams in. While such methods do update their models online without external side information, their models are hand-crafted (limited to finite-context statistics) and far less expressive than modern machine learning models. They also update only simple counts or weights, which limits their ability to capture complex or long-range dependencies in data.

In recent years, machine learning techniques have been applied to compression. For example, neural network-based compressors use recurrent neural networks (RNNs) or Transformer models to predict the next symbol and drive an entropy coder. Research efforts such as DeepZip and subsequent Transformer-based text compressors have shown that large neural models can serve as powerful predictors for compression. More recently, researchers demonstrated that large pretrained language models (LLMs) can serve as strong static predictors (see, e.g., Delétang et al., "*Language Modeling Is Compression*," ICLR 2024) by using a frozen model to provide probabilities to an arithmetic coder. These approaches, however, do not update the model parameters during compression—the predictive model remains fixed (or "frozen") at compression time. As a result, the model's predictions may be suboptimal for a specific data stream, especially if the stream's statistical distribution differs significantly from the model's training data. Some works discuss theoretical "online coding" or prequential techniques (where a model is updated as data arrives to evaluate coding efficiency), but they stop short of providing a practical two-party compression protocol that ensures an encoder and decoder remain synchronized.

Another category of related art involves learned compression systems that fine-tune models on a per-instance basis, especially in media compression (images, audio, video). For example, certain image or video compression schemes incorporate adaptive neural networks that are partially trained on the specific content being compressed to improve rate-distortion performance. These approaches, however, typically operate in a lossy compression setting or require transmitting side information such as updated model weights, latent codes, or hyperprior parameters to the decoder. In other words, if a neural compression system fine-tunes its model for a given image or video, the updated model (or some representation of it) must be sent along with the compressed data so that the decoder can mirror the encoder's state. This added overhead can be quite large and can undermine the benefits of adaptation in a lossless scenario. Moreover, in practical deployment, neural model compression schemes have faced challenges with cross-platform determinism: floating-point arithmetic differences between hardware platforms (or nondeterministic GPU operations) can cause the decoder's model state to diverge from the encoder's, breaking lossless reconstruction unless special measures are taken.

Accordingly, there exists a clear need in the art for a deterministic, online-adaptive lossless compression technique that leverages the predictive power of large-scale models while avoiding the pitfalls of prior approaches. Such a solution would preferably: (i) improve its prediction quality (and thus compression efficiency) as more of the data stream is observed; (ii) require no transmission of model updates or side information between encoder and decoder (beyond the ordinary compressed bitstream); and (iii) remain robust to real-world issues like channel noise or differences in computing platforms, ensuring that the encoder and decoder stay bit-synchronized at all times. No existing general-purpose compressor or machine-learning-based compression method currently provides this combination of capabilities in a practical, deployable form.

SUMMARY OF THE INVENTIONS

The present inventions address the above needs by providing a lossless compression system driven by a shared predictive model that both the encoder and decoder adapt in lockstep using only data that has already been transmitted and decoded. In essence, the same machine learning model (for example, a large neural network or other foundation-scale model) is instantiated at both a compressor (sender) and a decompressor (receiver). As data is compressed and transmitted block by block, both instances of the model are synchronously and identically updated based solely on data that the decoder has successfully received and decoded. This allows the model to gradually specialize to the particular characteristics of the data stream, thereby improving compression efficiency over time, without ever sending the model's parameters or update information through the channel.

In one aspect, the present inventions may include method of lossless data compression comprising: receiving, by an encoder, an input block of symbols from a data stream; generating, by a predictive model comprising a frozen base model and an updatable parameter subset, probability distributions for symbols of the input block; entropy encoding, by an entropy coder, the input block into a codeword using the probability distributions; transmitting the codeword as part of a compressed bitstream over a channel to a decoder; updating, by the encoder, the updatable parameter subset according to a deterministic update rule using the input block as training data; decoding, by the decoder, the compressed bitstream using the predictive model to reconstruct the input block by entropy decoding; and updating, by the decoder, the updatable parameter subset according to the same deterministic update rule using the reconstructed block, wherein synchronization between encoder and decoder is maintained without transmission of model parameters. Another feature of this aspect of the present inventions may be that the updatable parameter subset comprises adapter modules inserted into a largely frozen neural network. Another feature of this aspect of the present inventions may be that the deterministic update rule is executed by an optimizer whose state is derivable from public hyperparameters, block indices, and observed data. Another feature of this aspect of the present inventions may be that method may further comprise inserting, by the encoder, periodic synchronization beacons into the compressed bitstream, each beacon encoding a compact representation of the updated model state, and verifying, by the decoder, each beacon against a locally computed value. Another feature of this aspect of the present inventions may be that the method may further comprise initiating a resynchronization procedure upon detecting a beacon mismatch, the resynchronization procedure comprising one of: rolling back the predictive model to a previously verified state or applying a corrective delta transmitted from the encoder. Another feature of this aspect of the present inventions may be that the entropy coder is selected from the group consisting of arithmetic coding, range coding, rANS coding, and table-based tANS coding, and wherein coding precision and renormalization parameters are fixed to ensure reproducibility. Another feature of this aspect of the present inventions may be that numerical determinism is enforced by constraining computation kernels, fixing random number generator seeds, and applying explicit rounding rules such that identical inputs and hyperparameters yield identical outputs at encoder and decoder across different platforms. Another feature of this aspect of the present inventions may be that the compressed bitstream further comprises integrity metadata including per-block checksums or forward error correction information. Another feature of this aspect of the present inventions may be that tokenization of the input block is modality-specific and selected from the group consisting of byte-level tokenization, subword tokenization, image patch tokenization, quantized residual tokenization, and audio latent representation. Another feature of this aspect of the present inventions may be that the predictive model is initialized from a pretrained checkpoint and is progressively specialized to the input stream through successive deterministic updates, thereby reducing average coding rate in bits per symbol over time.

In another aspect, the present inventions may include a system for lossless data compression comprising: an encoder including a predictive model with an updatable parameter subset and an entropy coder, the encoder configured to encode input data into a compressed bitstream and to apply deterministic updates to the updatable parameter subset; a decoder including a corresponding predictive model and an entropy decoding module, the decoder configured to decode the compressed bitstream and to apply identical deterministic updates to the updatable parameter subset; and a synchronization mechanism comprising beacon signals and optional resynchronization procedures, whereby the encoder and decoder remain in lockstep without transmission of model parameters. Another feature of this aspect of the present inventions may be that the encoder further comprises a dispatcher configured to distribute data packets to multiple compressor processes each associated with a distinct predictive model, and a transmitter configured to select compressed outputs from the compressor processes and transmit them together with compression metadata. Another feature of this aspect of the present inventions may be that the decoder comprises multiple decompressor processes configured to reconstruct data packets using predictive models corresponding to the models used by the encoder. Another feature of this aspect of the present inventions may be that the predictive model includes adapter modules with updatable parameters updated deterministically via an optimizer along an update path, with optimizer state derivable from public hyperparameters. Another feature of this aspect of the present inventions may be that the system is configured to reduce average bits-per-symbol coding rate as more data is processed, yielding an adaptive coding efficiency trajectory lower than that of a static predictor. Another feature of this aspect of the present inventions may be that the synchronization mechanism further comprises validation modules that compare received beacon values against historical parameter states. Another feature of this aspect of the present inventions may be that the system may further comprise applying auxiliary processes for model fine-tuning during long-running streams, wherein fine-tuned models replace original models after synchronization with the decoder. Another feature of this aspect of the present inventions may be that auxiliary processes provide redundancy or load balancing across multiple compressor or decompressor modules. Another feature of this aspect of the present inventions may be that error-control modules are integrated into the pipeline to perform checksum verification, forward error correction, or adaptive buffering during compression and decompression. Another feature of this aspect of the present inventions may be that best-mode operation comprises implementing the predictive model as a Transformer architecture pretrained on a mixed corpus of text and binary data, updating adapter modules with a stochastic gradient descent optimizer using a fixed learning rate and predetermined block size.

More specifically, in one aspect of the inventions, with reference to FIG. 3, an encoder (1510) uses a predictive model (1560) to estimate probabilities for the next symbols of an input data stream. An entropy coding algorithm (1550) (such as arithmetic coding or Asymmetric Numeral Systems, ANS) then encodes the actual symbols into a compressed codeword (1554) using those probabilities. After encoding a block of data (which may consist of one or more symbols or tokens), the encoder updates the predictive model's parameters by performing a prescribed learning procedure—e.g. one or more gradient descent steps on the model using the just-encoded data block as training samples to minimize prediction error. The decoder (1520) performs the exact same update procedure on its copy of the predictive model after decoding that block. Because the decoder sees the same data (having just decompressed that block) and knows the learning procedure and hyperparameters in advance, it can replicate the model update deterministically. In this way, the encoder and decoder's models remain identical at all times, eliminating any need to transmit updated weights or other side information. The only information sent over the channel is the entropy-coded data (and occasional synchronization signals), which by itself is sufficient for the decoder to both recover the original data and mirror the encoder's model state.

In some embodiments, the system incorporates additional features to ensure synchronization, robustness, and efficiency. For example, the encoder may periodically insert compact synchronization beacons (1590, 1692) into the compressed bitstream, each beacon encoding a truncated hash or other representation of the model's current state. The decoder verifies each received beacon against its own recomputed model state (1794) to confirm that it remains in lockstep with the encoder; if a mismatch is detected, resynchronization procedures (such as rolling back to a checkpoint or applying a corrective delta) can be initiated to realign the models. The model updates are restricted to a limited subset of parameters—such as adapter modules (1570, 1870) inserted into a largely fixed neural network—so that the adaptation process is computationally efficient and deterministic. The update rule itself is deterministic and can be executed by an optimizer (1580, 1680, 1880) whose state (1884) is derivable from public hyperparameters and counters, ensuring that both encoder and decoder compute identical parameter changes. The compressed bitstream may further include integrity metadata or error-correction information (1595) (e.g. checksums or forward error correction codes) to detect or correct any channel errors. Overall, the architecture yields a compressor/decoder system (1500) whose average coding rate (bits per symbol) decreases over time as the predictive model becomes more specialized to the data (see FIG. 7), outperforming a static predictor under the same coding scheme while still guaranteeing strict losslessness.

Other features, aspects and advantages of the present inventions will become apparent from the following discussion and detailed description.

Predictor 1560 and updatable subset $\Theta_u$ 1562 generate probabilities 1552 used by entropy coding subsystem 1550 to emit codeword 1554. Optimizer 1580 applies deterministic update 1582 to parameters 1562, safeguarded by beacon/verifier 1590 and insertion module 1592.

Figure 4:
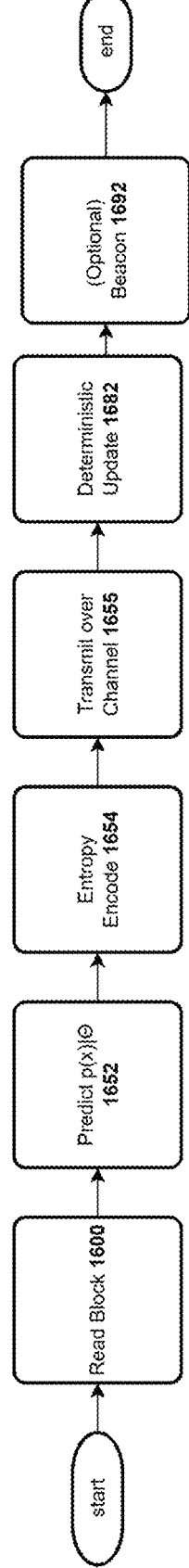

FIG. 4 is a flow diagram of the encoder pipeline. Input block 1600 is processed by predictor 1560 at stage 1652 to generate distributions, which are entropy-encoded at stage 1654 into codeword 1554. Framing occurs at stage 1655. Optimizer 1680 applies deterministic update 1682, and beacon insertion occurs at stage 1692. Optional error-control module 1595 performs checksum or forward error correction before updates are applied.

Figure 5:
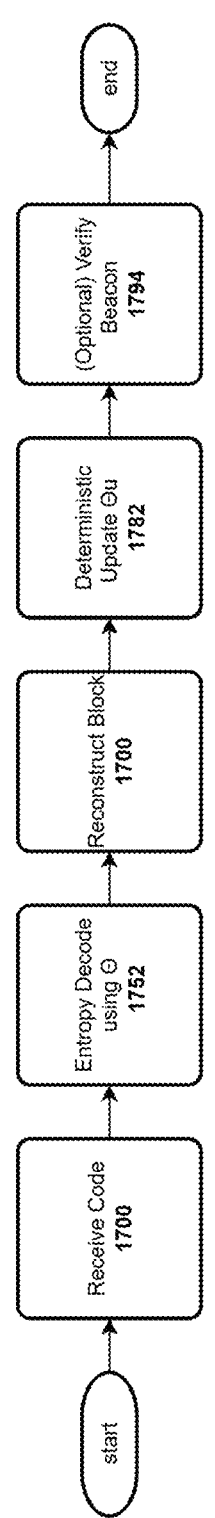

FIG. 5 is a flow diagram of the decoder pipeline. A compressed block 1700 is received and decoded at stage 1752 using predictor 1560 to recover the original sequence. Deterministic update 1782 mirrors the encoder update. Beacon verification occurs at stage 1794, ensuring synchronization.

Figure 6:
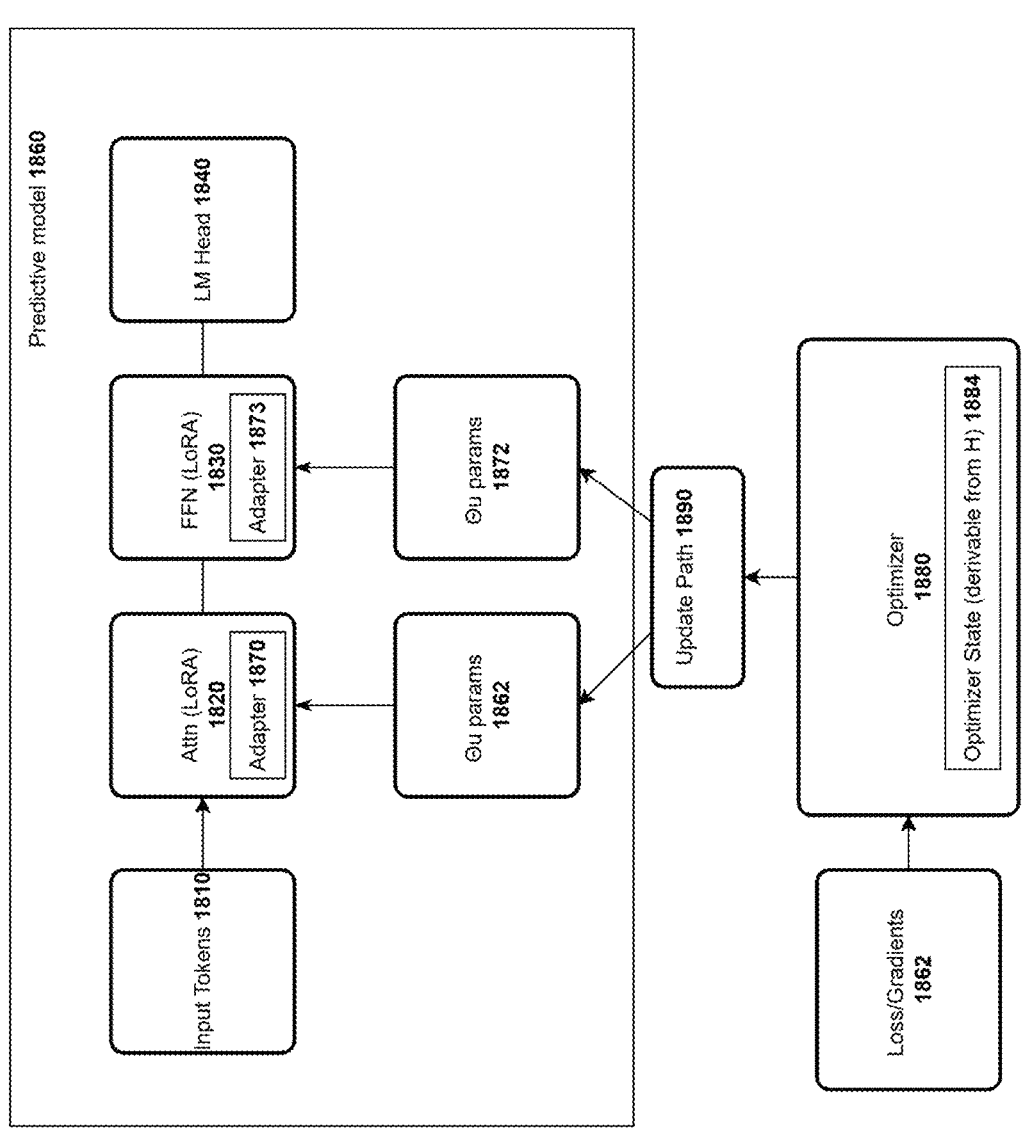

FIG. 6 is a schematic of adapter-only parameterization. Input token stream 1810 passes through attention sublayer 1820 and feed-forward sublayer 1830 into language-model head 1840. Loss 1850 is back-propagated through base model 1860 with adapter modules 1870, 1873, exposing trainable parameters 1862, 1872. Optimizer 1880 applies updates along path 1890, with auxiliary optimizer state 1884 derived deterministically from public hyperparameters and block indices.

Figure 7:

FIG. 7 is a graph of coding efficiency. The horizontal axis ("Data Processed") shows cumulative input size, and the vertical axis ("Bits per Symbol") shows compression rate. The dashed curve represents a static predictor, while the solid curve represents the adaptive system employing deterministic updates 1682/1782 on subsets 1562/1862. Markers may denote block sizes 1600/1700 and beacon stages 1692/1794.

While the inventions will be described in connection with the preferred embodiments, it will be understood that the scope of protection is not intended to limit the inventions to those embodiments. On the contrary, the scope of protection is intended to cover all alternatives, modifications, and equivalents as may be included within the spirit and scope of the inventions as defined by the appended claims.

DETAILED DESCRIPTION OF THE INVENTION

As will be appreciated by those skilled in the art, aspects of the present inventions may be embodied in various forms, including an entirely hardware implementation, an entirely software implementation (e.g. firmware, resident software, micro-code, etc.), or a combination of software and hardware elements. All such aspects may generally be referred to herein as a "circuit," "module," or "system." Furthermore, aspects of the present inventions may take the form of a computer program product embodied in one or more computer-readable media having computer-readable program code instructions stored thereon.

Any combination of computer-readable media may be utilized to implement the inventions. A computer-readable medium may be a computer-readable storage medium or a computer-readable signal medium. A computer-readable storage medium may be, for example, but not limited to, an electronic, magnetic, optical, electromagnetic, infrared, or semiconductor system, apparatus, or device, or any suitable combination of the foregoing. Specific examples of storage media include, but are not limited to: an electrical connection having one or more wires; a portable diskette; a hard disk; a random access memory (RAM); a read-only memory (ROM); an erasable programmable read-only memory (EPROM or Flash memory); an optical fiber; a portable compact disc read-only memory (CD-ROM); an optical storage device; or a magnetic storage device. In the context of the present inventions, a computer-readable storage medium is any tangible medium that can contain or store program instructions for use by an instruction execution system, apparatus, or device.

A computer-readable signal medium may include a propagated data signal with computer-readable program code embodied therein (for example, in baseband or as part of a carrier wave). Such a propagated signal may take any of a variety of forms, including but not limited to electromagnetic or optical signals, or any suitable combination thereof. A computer-readable signal medium may be any computer-readable medium that is not a storage medium, and that can communicate, propagate, or transport program instructions for use by an instruction execution system, apparatus, or device.

Program code embodied on a computer-readable medium may be transmitted using any appropriate transmission medium, including but not limited to wireless communication, wireline communication, optical fiber cable, radio frequency (RF), or any suitable combination of these.

Computer program code for carrying out operations of aspects of the present inventions may be written in any combination of one or more programming languages. Examples include object-oriented programming languages (for example, Java®, Smalltalk, or C++), as well as conventional procedural programming languages (for example, C or similar languages). The program code may execute entirely on a single computer (e.g. the encoder or the decoder), partly on one computer and partly on another (e.g. a client-server or distributed environment), or entirely on a remote computer or server. In the latter scenario, the remote computer may be connected to the local system through any type of network, including a local area network (LAN), a wide area network (WAN), or the Internet (via an Internet Service Provider or other network connection).

Aspects of the present inventions are described below with reference to flowchart illustrations and block diagrams in the accompanying figures, which depict various method, system, and computer program product embodiments. It will be understood that each block or step shown in these diagrams, as well as combinations of blocks, may be implemented by computer program instructions. These program instructions may be provided to a processor of a general purpose computer, special purpose computer, or other programmable data processing apparatus to cause the processor to execute the instructions, thereby creating a machine that implements the functions/acts specified in the flowchart or block diagram block(s).

These computer program instructions may also be stored in a computer-readable storage medium that can direct a computer or other programmable data processing apparatus to function in a particular manner, such that the instructions stored in the medium produce an article of manufacture including instruction means that implement the functions/acts specified in the flowchart or block diagram. The computer program instructions may further be loaded onto a computer or other programmable apparatus to cause a series of operational steps to be performed on the device to produce a computer-implemented process. In this manner, the instructions executing on the computer or other programmable apparatus provide processes for implementing the functions/acts specified in the flowchart and/or block diagram blocks.

Figure 1:
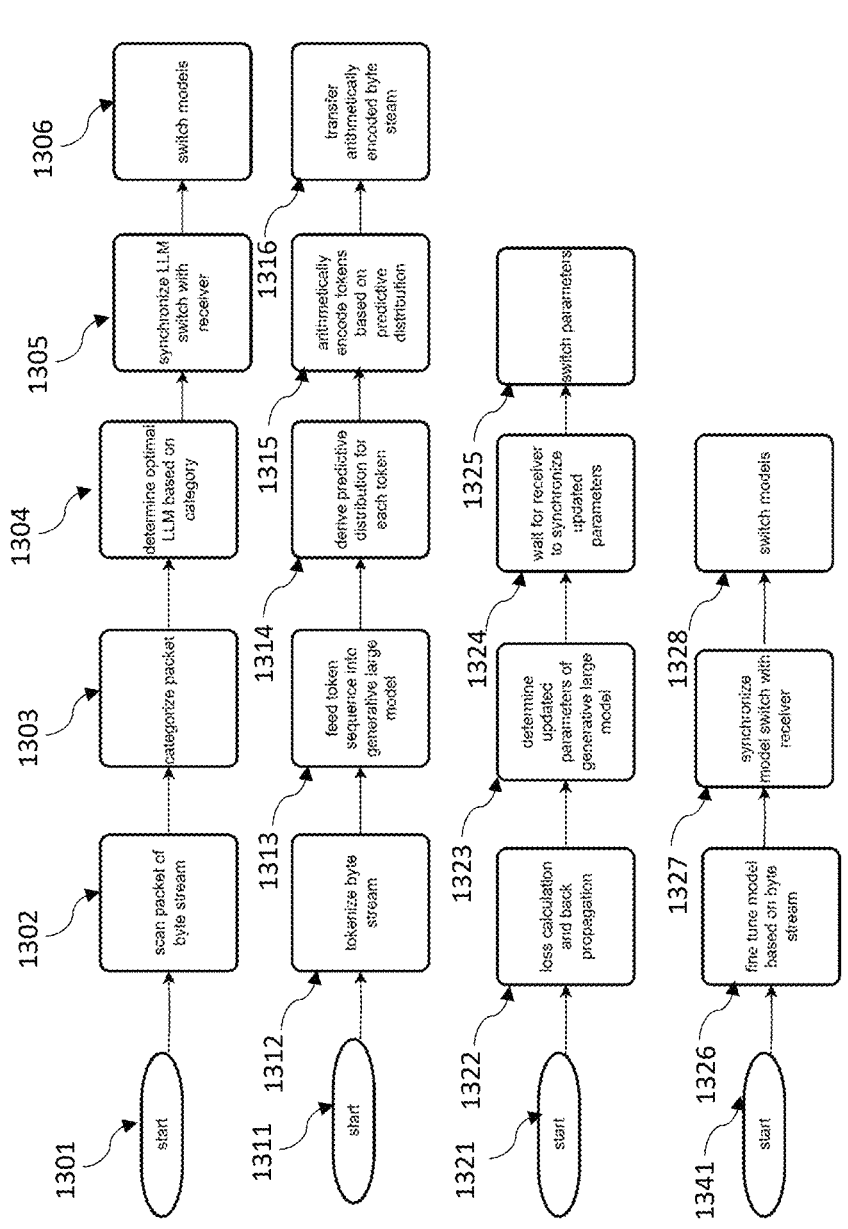
FIG. 1 is a flow diagram depicting multiple coordinated compression flows. Entry points 1301, 1311, 1321, and 1341 illustrate different compression modes. Steps 1302-1305 handle model switching and synchronization; stage 1306 provides an optional diagnostic validation stage. Steps 1312-1315 perform tokenization, prediction, and entropy coding; stage 1316 provides optional post-entropy validation. Steps 1322-1325 carry out lockstep parameter adaptation; steps 1326-1328 illustrate fine-tuning substitution with synchronization verification.

FIG. 1—Flow Diagram of Compression Flows. Referring now to FIG. 1, there is shown a flow diagram depicting several coordinated paths for carrying out compression in accordance with embodiments of the present inventions. The figure illustrates four principal flows, commencing at reference numerals 1301, 1311, 1321, and 1341 respectively. Each flow may operate independently or in various combinations, and in certain preferred embodiments all flows may be active simultaneously to maximize compression efficiency and adaptability.

In the first flow, beginning at 1301, the system enables dynamic model switching during an active compression session. At step 1302, a packet of the input byte stream is scanned and analyzed. The packet is then categorized in step 1303, wherein the system assigns a semantic label or category to its contents. Such categorization may occur at a high level (for example, identifying whether the data comprises text, image, or audio content) or at a finer granularity (for example, classifying text as "financial newswire," "medical report," or "Java source code"). Based upon the assigned category, step 1304 selects a predictive model deemed most suitable for compression of that data type. Once a new model has been selected, step 1305 synchronizes the model switch with the decoder by embedding appropriate metadata into the compressed bitstream 1535, thereby ensuring that both the encoder and decoder apply the same model starting at the same position in the data stream.

The second flow, commencing at 1311, represents a core compression path upon that may be applicable to all embodiments. At step 1312, the input byte stream is tokenized into a representation suitable for processing by a large predictive model. In a preferred embodiment, the tokenization process may produce subword units, raw bytes, or modality-specific tokens (for example, quantized image patches for visual data). Step 1313 processes the resulting token sequence through the predictive model (e.g. a Transformer or recurrent neural network) to generate contextual embeddings or state. In step 1314, the model's output is used to derive a predictive probability distribution for the next possible tokens or symbols. Step 1315 then applies an entropy coding procedure—for example, arithmetic coding or rANS—to encode the observed tokens into the compressed bitstream in accordance with the predicted probabilities.

The third flow, beginning at 1321, introduces synchronous parameter adaptation between encoder and decoder. In step 1322, immediately after encoding a block of data, the encoder computes a loss function (such as the negative log-likelihood of the just-encoded block) and performs a gradient backpropagation through the updatable parameter subset 1562 of the model. In step 1323, parameter updates are computed according to a deterministic optimizer 1580 using public hyperparameters known to both sides (for example, a fixed learning rate, clipping threshold, and so on). Step 1324 awaits confirmation (implicitly or via protocol signals) that the decoder has executed the corresponding computations, thereby ensuring that both sides remain in sync. Step 1325 then applies the calculated parameter update to the encoder's predictive model. Because the decoder will perform the identical procedure upon decoding the same block of symbols, both encoder and decoder remain synchronized without requiring any transmission of model weight updates.

The fourth flow, originating at 1341, illustrates an online fine-tuning path for long-running streams. At step 1326, the predictive model undergoes fine-tuning using the stream data that has been compressed thus far. Step 1327 introduces a synchronization procedure by which the decoder verifies that it has arrived at an equivalent fine-tuned model state (for instance, by comparing a hash or signature of the model, or by checking a beacon as described below). Once synchronization is confirmed, step 1328 effects a substitution whereby the original model is replaced with the fine-tuned version for subsequent compression and decompression. This permits the system to benefit from highly domain-specific adaptation in long streams while still preserving the guarantee of strict lossless reconstruction.

Collectively, the flows depicted in FIG. 1 show how the system can flexibly combine dynamic model selection, core entropy coding, synchronous lockstep model updating, and optional fine-tuning substitution. In preferred embodiments, these flows operate in concert, allowing the encoder and decoder to progressively adapt to the characteristics of the data stream while never departing from strict determinism and synchronization.

In certain embodiments, additional processing stages are provided. For example, stage 1306 may represent a diagnostic or monitoring subroutine that evaluates the results of step 1305 before the encoded stream is transmitted, thereby confirming that model switching metadata has been correctly embedded into the bitstream 1535. Similarly, stage 1316 may represent a validation or fallback path after step 1315, wherein the entropy-encoded symbols are checked against expected distributional properties to ensure encoder integrity before transmission. These additional stages, while not required in all embodiments, provide optional hooks for monitoring, error detection, or quality assurance within the compression pipeline.

Figure 2:
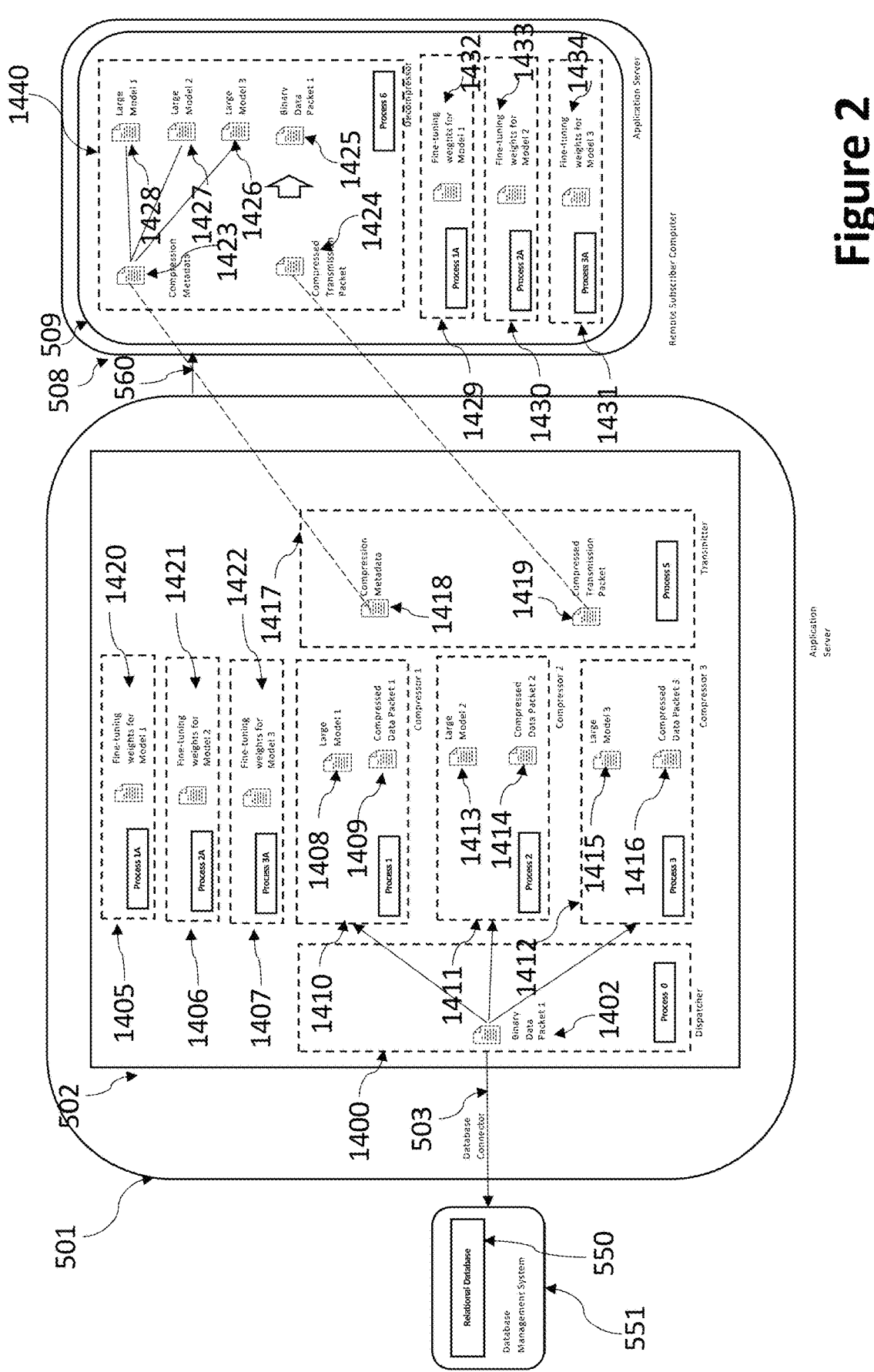
FIG. 2 is an architecture diagram showing parallelized compression and decompression. On the encoder side, dispatcher 1400 reads binary data packet 1402 (from database 550 via DBMS 551 and connector 503) and distributes to compressor processes 1410-1412. Each employs predictive models 1408, 1413, 1415, producing compressed outputs 1409, 1414, 1416. Optional fine-tuning processes 1405-1407 adapt models online. Transmitter 1417 forms compressed packet 1419 with metadata 1418. On the decoder side, compressed packet 1424 and metadata 1423 are received, and decompressor 1440 with subprocesses 1429-1431 reconstructs binary packet 1425 using models 1426-1428. Auxiliary processes 1420-1422 manage metadata validation, scheduling, and logging. Additional redundancy/error-control 1432-1434 may assist decompression. Remote subscriber 508 and application server 509 complete the pipeline over channel 560.

FIG. 2—Architecture Diagram. Referring now to FIG. 2, there is shown an architecture diagram illustrating an exemplary embodiment of a compression system for carrying out the flows of FIG. 1. On the encoder side, a dispatcher process 1400 reads an incoming binary data packet 1402 from a source (for example, a relational database 550 accessed via a database management system 551 and connector 503). The dispatcher segments the data into packets and distributes them to multiple compressor processes 1410, 1411, 1412. Each compressor employs a predictive model (illustrated as models 1408, 1413, and 1415) and generates a compressed output (illustrated as outputs 1409, 1414, 1416) for its assigned data segment. Optional fine-tuning processes 1405, 1406, and 1407 may refine the models online using the same input stream, allowing each model to specialize to different portions of the data.

A transmitter process 1417 then coordinates the outputs from the compressors, selecting the most efficient result to form a compressed transmission packet 1419. Compression metadata 1418 (which records which model was used for each portion of the data, along with any parameters or settings necessary for decoding) is included alongside the compressed data. The transmitter dispatches the packet and metadata across a communication channel 560 to a remote subscriber computer 508 (for example, a backup server) hosting a corresponding application server 509.

On the decoder side, a decompression system receives the compressed packet 1424 along with the associated metadata 1423. A decompressor process 1440, assisted by parallel subprocesses 1429, 1430, 1431, uses the metadata to determine which predictive model should be applied for each block of compressed data. The decoder hosts corresponding model instances 1426, 1427, 1428 that mirror the encoder-side models 1408, 1413, 1415. Using the information in metadata 1423, the decompressor reconstructs the binary output packet 1425, which exactly matches the original input packet 1402. In some implementations, pipeline parallelism is employed, allowing multiple stages of decompression to execute concurrently for different blocks or packets, thereby maintaining throughput even in high-volume deployments.

Thus, FIG. 2 illustrates how the dispatcher 1400, compressors 1410-1412, transmitter 1417, metadata 1418, and decompressor 1440 cooperate to realize a parallelized compression and decompression architecture with strict model symmetry. This architecture forms a foundation for adaptive lockstep neural compression in practice, enabling efficient handling of large-scale data streams by distributing work and keeping the encoder and decoder models aligned.

In some implementations, additional processes are illustrated in FIG. 2 and may be employed to enhance throughput and modularity. For example, Process 0 may represent an initial staging process that prepares a binary data packet 1402 for dispatch, such as by normalizing formats or applying preliminary checks before the dispatcher 1400 forwards the data. Process 5 and Process 6 may represent auxiliary compressor instances that operate in parallel with compressor processes 1410-1412, providing scalability when additional throughput is required. These auxiliary processes can host predictive models similar to models 1408, 1413, 1415 and produce corresponding compressed packets which may be routed through transmitter 1417.

On the decompression side, FIG. 2 further illustrates optional subprocesses 1420, 1421, and 1422, which may be used for pre-processing of metadata 1423, error detection, or load balancing across the main decompressor 1440 and its subprocesses 1429-1431. In one embodiment, subprocess 1420 validates the integrity of metadata, subprocess 1421 manages scheduling of decompression tasks, and subprocess 1422 performs error logging or checkpointing.

In some variants, additional decompression subprocesses 1432, 1433, and 1434 may be instantiated. These processes may provide redundancy or task-specific functionality, such as checksum verification, forward error correction decoding, or adaptive buffering. Together, these additional modules ensure that the decompression pipeline is resilient and capable of handling large-scale parallel data streams.

FIG. 2 also depicts a Decompressor 1, which may represent a dedicated decompression unit assigned to a particular data channel or partition. Decompressor 1 can act as a specialized endpoint within the decompression subsystem, ensuring deterministic alignment of its model state with that of the encoder-side compressor responsible for the corresponding channel.

Figure 3:
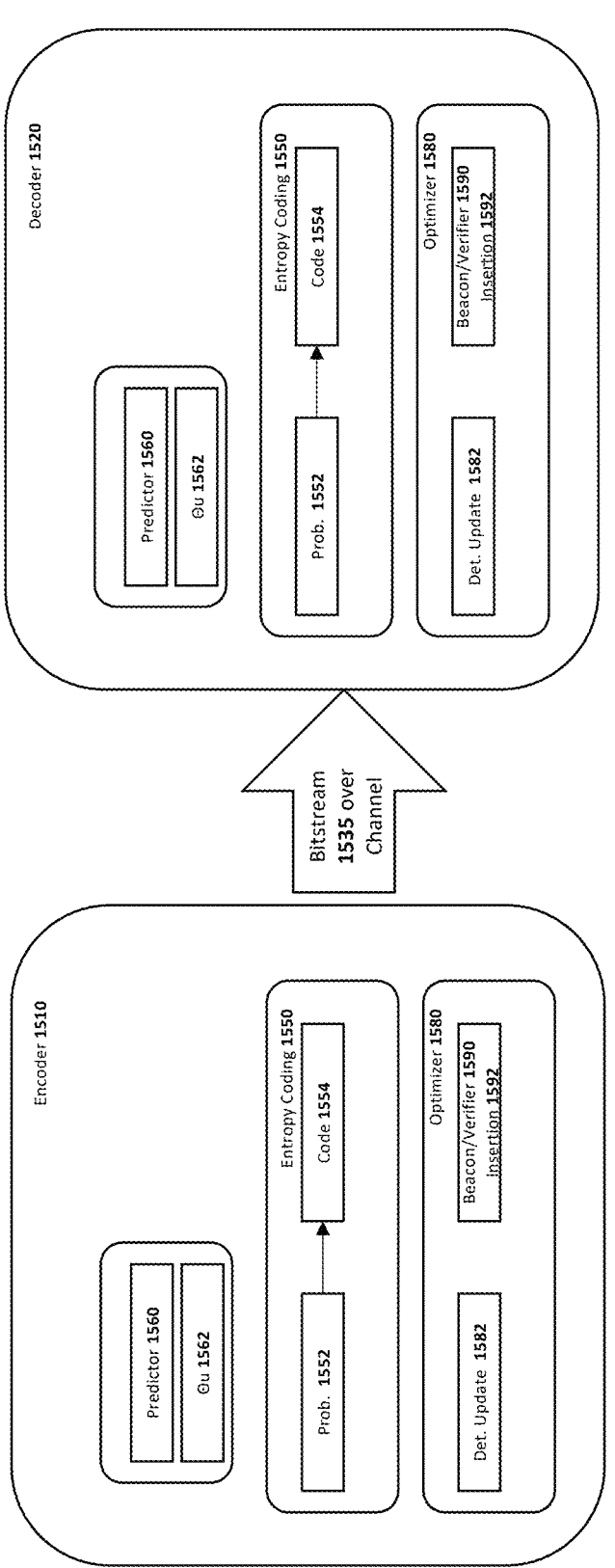
FIG. 3 is a block diagram of encoder 1510 and decoder 1520 communicating over channel 1530 via bitstream 1535.

FIG. 3—Encoder-Decoder System 1500. Referring now to FIG. 3, there is shown a block diagram of an encoder-decoder system architecture, designated generally as system 1500, that embodies the principles of the present inventions. In this system, an encoder 1510 communicates with a decoder 1520 via a transmission channel 1530 carrying a compressed bitstream 1535. The arrangement depicted in FIG. 3 illustrates how probabilities, codewords, model updates, and synchronization beacons are exchanged or applied in a coordinated manner to yield progressively improving, stream-specialized compression while preserving strict losslessness and lockstep adaptation.

Within the encoder 1510, a shared predictive model 1560 generates conditional probability distributions 1552 for each symbol of an input data block. The predictive model 1560 in this embodiment comprises a large pretrained neural network in which the majority of parameters remain fixed, together with a restricted subset of updatable parameters 1562. The encoder applies the probability distributions 1552 to an entropy coding subsystem 1550, which encodes the actual input symbols into a compressed codeword 1554. The entropy coder may be any suitable implementation (for example, arithmetic coding, range coding, or rANS), provided that its precision and renormalization rules are fixed such that the inverse decoding procedure is uniquely defined for the decoder 1520. The resulting codeword 1554 is then framed—optionally with integrity metadata such as checksums or identifiers—and transmitted as part of the bitstream 1535 over channel 1530.

Following the transmission of each block, the encoder performs a deterministic model update 1582 on the subset of parameters 1562. This update is computed by an optimizer 1580 operating under a fixed set of public hyperparameters (such as a specified learning rate schedule, gradient clipping threshold, and step count). The optimizer 1580 ensures that the new parameter values are a deterministic function of the observed data and the shared hyperparameters. Because of this determinism, the update does not require any side information to be communicated to the decoder. To further safeguard synchronization, the encoder may generate a compact beacon signal 1590 (for example, a truncated cryptographic hash of the updated parameters or a probe prediction result) and insert it into the bitstream at predetermined intervals via a beacon insertion module 1592.

The decoder 1520 is organized symmetrically to the encoder. It instantiates the same predictive model 1560, including the identical subset of updatable parameters 1562, initially in the same state as the encoder's model. Upon receiving a compressed codeword 1554 from the bitstream 1535, the decoder applies the inverse of the encoder's entropy coding process (within a corresponding decoding subsystem, analogous to 1550) to reconstruct the original block of symbols. Because the decoder reproduces, step by step, the same probability distributions 1552 that the encoder used during compression, the entropy decoding operation (1752) yields the exact original sequence of symbols. Immediately after decoding each block, the decoder applies the same deterministic model update 1582 (represented on the decoder side as 1782) to its local copy of parameters 1562, using the reconstructed block as training data and employing the identical optimizer 1580 with the same hyperparameters. In this manner, the decoder's model remains in lockstep with the encoder's model, converging to the same updated state without ever receiving explicit parameter updates from the encoder. When beacon signals 1590 are present in the bitstream, the decoder also computes the expected beacon value from its local model state and verifies it against the received beacon (1794). In the event of a mismatch, the decoder can initiate a resynchronization procedure (for example, by requesting a small corrective delta or by reverting to the last known good state) to repair any divergence and re-align the model states.

As further illustrated in FIG. 3, a beacon insertion module 1592 is shown in association with encoder 1510. This module governs the timing and formatting of synchronization beacons 1590, ensuring they are embedded in the bitstream 1535 at predetermined intervals. On the decoder side 1520, the corresponding verification logic compares the embedded beacon with its recomputed equivalent. FIG. 3 also depicts an optimizer 1550 on both encoder and decoder sides, symbolically representing the deterministic update logic applied to parameters 1562. Although labeled similarly to the entropy coding subsystem 1550, the optimizer instance is logically distinct and responsible for parameter updates rather than symbol coding. Both components operate under identical constraints, thereby avoiding divergence.

Prior to operation, the encoder and decoder agree on various configuration elements to ensure they remain synchronized. These agreed-upon settings include, for example: the initial model checkpoint (the starting weights of the predictive model 1560); the tokenization scheme or vocabulary to be used for the data (e.g. whether data is processed as bytes, words, subwords, or other tokens); the update rule U (for example, a specific optimizer algorithm such as SGD or Adam with fixed hyperparameters); the definition of the updatable parameter subset $\Theta_u$ (for example, specifying that only certain adapter layers or bias terms are updatable, while the rest of the model remains fixed); the block size and update frequency (cadence) for model updates; the beacon scheme and interval; and any numerical determinism settings (such as fixed data types, use of only deterministic GPU kernels, and explicit rounding rules). By establishing these parameters in advance, the encoder and decoder ensure that they will perform identical computations on identical data, thereby proceeding in perfect lockstep throughout the compression process.

Accordingly, the system architecture 1500 of FIG. 3 demonstrates how the encoder 1510 and decoder 1520 cooperate by exchanging only compressed codewords (bitstream elements 1535 containing codewords 1554 and occasional beacons 1590), while each side reproduces identical parameter updates 1582 on the updatable parameters 1562. This lockstep arrangement achieves progressively improved compression efficiency over time—as the shared predictive model 1560 becomes increasingly specialized to the data stream—while guaranteeing strict lossless recovery of the original source data at the decoder.

FIG. 4—Encoder Pipeline. Referring now to FIG. 4, there is shown a flow diagram of an encoder pipeline that produces a compressed bitstream while maintaining decoder synchronization without transmitting model updates. The sequence depicted in FIG. 4 illustrates how an encoder processes successive blocks of data in a deterministic manner, updating a shared predictive model while ensuring that the decoder can mirror each step without receiving any side-channel parameter information.

The pipeline commences at block 1600, where the encoder obtains the next unit of source data for processing. The block size may be fixed or may adapt based on content or other criteria, and it may be chosen to align with natural data boundaries or predetermined token counts. In certain embodiments, integrity metadata such as a checksum is computed at this stage to facilitate later verification of correct transmission and decoding.

At stage 1652, the encoder applies the shared predictive model 1560 (see FIG. 3) in its current state $\Theta$ to generate, for each symbol in the block, a conditional probability distribution over possible next symbols. Because the tokenization, vocabulary, and numerical precision settings are predetermined and fixed, the distributions generated at this stage are reproducible in an identical manner by the decoder. The encoder then passes these probability distributions to the entropy coding subsystem.

At stage 1654, the encoder converts the predicted probability distributions into a compressed codeword using an entropy coding algorithm (for example, arithmetic coding or rANS). The entropy coder operates under fixed renormalization and quantization rules so that the inverse decoding procedure is uniquely defined. The codeword is emitted in a format that allows the decoder to reconstruct the original sequence symbol-by-symbol, given the same sequence of probability distributions.

At stage 1655, the encoder frames the resulting codeword for transmission. Framing may include the addition of length delimiters, per-block checksums, or optional forward error correction codes, without affecting the fundamental lossless property of the compression. The framed codeword is then transmitted as part of the bitstream 1535 across channel 1530 to the decoder.

After transmitting the block's codeword, the encoder executes a deterministic update 1682 of the restricted parameter subset $\Theta_u$ (the updatable parameters, e.g. 1562). This update is computed using the just-encoded block as training data and is applied by an optimizer operating under fixed public hyperparameters. For example, the encoder might compute the gradient of the negative log-likelihood loss for the block, optionally clip the gradient, and then apply a predetermined learning rate step to the adapter parameters. Because the update rule is deterministic and entirely a function of data that will be available at the decoder (the decoded block) and fixed hyperparameters, the decoder can replicate this update exactly upon decoding the same block.

Finally, at stage 1692, the encoder may insert a lightweight synchronization beacon into the bitstream. The beacon may take the form of a truncated hash of the updated parameters, a small checksum, or a probe prediction produced by the updated model under a known prompt. These beacons allow the decoder to verify that its model state remains identical to that of the encoder. If a beacon indicates a mismatch, resynchronization procedures (described elsewhere herein) may be invoked to realign the model states.

The sequence described in FIG. 4—namely, 1600→1652→1654→1655→1682 (with an optional 1692 beacon insertion)—repeats for successive blocks of the input stream. As a result, the predictive model becomes progressively more specialized to the data, while the encoder and decoder remain in strict lockstep. Notably, only entropy-coded data and occasional beacons are transmitted; no explicit model parameter updates are sent over the channel.

FIG. 4 may also include explicit validation stages for integrity metadata, represented by optional blocks between stages 1655 and 1682. Such steps can involve per-block checksum comparison or forward error correction 1595 routines to catch errors before parameter updates are applied. This ensures that updates 1682 are based only on verified, error-free data.

FIG. 5—Decoder Pipeline. Referring now to FIG. 5, there is shown a flow diagram of a decoder pipeline for reconstructing a block of data using a synchronized predictive model. The decoder operates in strict correspondence with the encoder pipeline of FIG. 4, ensuring that each stage of entropy decoding and model updating proceeds deterministically so that the original data is recovered bit-for-bit.

The pipeline begins when the decoder receives a compressed codeword representing a pending data block, indicated generally at 1700. The codeword may arrive via any suitable communication channel or medium, including a reliable byte-stream protocol, a packet-based transport (optionally protected by error-correcting codes), or even an offline file transfer. If the codeword is framed with metadata such as checksums or length indicators, the decoder first verifies this framing information to ensure that the incoming data block is intact and ready for decoding.

At stage 1752, the decoder performs the inverse of the encoder's entropy coding step. Using its local copy of the predictive model 1560 in its current state $\Theta$, the decoder regenerates—symbol by symbol—the same sequence of probability distributions that the encoder computed during compression. The entropy decoding procedure (for example, arithmetic decoding or rANS decoding) uses these distributions to interpret the codeword and reconstruct the original symbols exactly. Because the probability distributions are deterministically generated under fixed numerical settings, and because the entropy coder's rules for precision and renormalization are fixed and known, the decoder is guaranteed to reproduce the exact sequence of symbols that was encoded by the encoder.

The output of stage 1752 is a reconstructed block of symbols, indicated again at 1700 in FIG. 5. This block is emitted in its original order and format. Where per-block integrity metadata (for example, a checksum) was provided by the encoder, the decoder at this point verifies that metadata to ensure that no transmission error corrupted the block during transit.

After successfully reconstructing the block, the decoder applies a deterministic model update 1782 to the restricted subset of updatable parameters $\Theta_u$ of its predictive model. The update is computed using the reconstructed block as training data and by applying the identical optimizer (with identical hyperparameters) that the encoder used. For example, the decoder computes the same gradient of negative log-likelihood, applies any prescribed clipping, and performs the same learning-rate step to update its adapter parameters. Because all quantities are deterministically derived from the observed data and the shared configuration values, the updated parameters at the decoder are guaranteed to match those at the encoder after the encoder's update 1682. In this way, the predictive model at both ends remains synchronized across each processed block.

At stage 1794, the decoder optionally verifies a synchronization beacon that was inserted by the encoder at stage 1692 of FIG. 4. The beacon could be, for example, a truncated cryptographic hash of the adapter parameters $\Theta_u$, an authenticated probe output, or another compact indicator of the model state. If the beacon value computed locally by the decoder matches the value embedded in the bitstream, the decoder confirms that it remains in lockstep with the encoder and proceeds to process the next block. If a mismatch is detected, the decoder initiates a resynchronization procedure, which may include actions such as rolling back its model to a previously verified checkpoint or applying a compact corrective delta received from the encoder. These procedures ensure robustness against occasional transmission errors or any rare nondeterministic divergences in computation.

The sequence of FIG. 5—comprising reception of codeword 1700, entropy decoding 1752, reconstruction of block 1700, deterministic update 1782, and optional beacon verification 1794—repeats for each successive block of the data stream. By mirroring the encoder pipeline on a block-by-block basis, the decoder not only achieves exact reconstruction of the source data, but also maintains an identically adapted predictive model. This continuous co-adaptation of the model at both encoder and decoder enables the system to improve its compression efficiency over the course of the stream without ever sacrificing lossless fidelity.

In some embodiments, additional validation logic may be positioned adjacent to beacon verification stage 1794. This includes cross-checking received beacons against a rolling history of parameter states, or comparing probe predictions under controlled inputs. These auxiliary checks ensure that synchronization errors are caught even if a single beacon were corrupted.

In addition to beacon verification, several fallback resynchronization mechanisms may be employed. In one embodiment, if a beacon mismatch is detected, the encoder transmits a compact delta patch describing only the differences between its adapter parameters $\Theta_u$ and those of the last verified state. The decoder applies the patch to restore alignment, with typical patch sizes ranging from 4 to 16 kilobytes depending on block history. In another embodiment, a rolling reinitialization procedure is used, in which both encoder and decoder reset their predictive models to the initial state Oo after every M blocks, thereby bounding divergence to a limited window. In a further embodiment, a dual-layer beacon system is used: a lightweight checksum beacon is sent every block, while a deeper hash beacon reflecting full adapter state is sent at longer intervals. This multi-tier approach balances low overhead with high assurance of long-term synchronization.

FIG. 6—Adapter-Only Parameterization. Referring now to FIG. 6, there is shown a schematic representation of an adapter-only parameterization of a predictive model, designated generally as 1860, that is suitable for synchronized online adaptation during lossless compression. The figure illustrates how adaptation of the model is confined to lightweight "adapter" modules, thereby bounding computational cost and ensuring that updates can be reproduced deterministically across the encoder and decoder.

An input token sequence 1810 is first processed through an attention sub-layer 1820 and a feed-forward sub-layer 1830, which together may be representative components of a transformer-based predictive model. The outputs of these sub-layers are provided to a language model head 1840, which generates a probability distribution over the next-symbol predictions. During normal operation, the large base weights of model 1860 remain fixed and are not updated, thereby preserving stability and determinism across the two endpoints.

To allow the model to specialize progressively to the observed data stream, small adapter modules are inserted into the model's architecture. For example, as illustrated in FIG. 6, an adapter module 1870 may be inserted into the attention path 1820 and another adapter module 1873 may be inserted into the feed-forward path 1830. These adapters introduce a restricted set of additional trainable parameters (illustrated as 1862 for the first adapter and 1872 for the second adapter). The adapter parameters can include, for instance, low-rank matrices, per-channel scaling factors, or bias terms. In certain embodiments, calibration parameters associated with the output head 1840—such as temperature scaling factors or bias vectors—may also be included in the updatable set. By limiting adaptation to these parameters, the system confines the online learning process to a footprint that is small enough to be executed deterministically and mirrored at both encoder and decoder.

Following the entropy coding or decoding of each block, a loss signal 1850 is computed (for example, the negative log-likelihood of the just-encoded or just-decoded tokens under the current model distribution). This loss is backpropagated through the model 1860 while treating the large base model weights as constants (i.e., no gradients are applied to the fixed parameters). An optimizer 1880 then applies a deterministic update along an update path 1890 to the adapter parameters 1862, 1872 of the adapters 1870, 1873. If the optimizer requires auxiliary state (for example, momentum terms or step counters), this information is defined as optimizer state 1884 and is itself constructed as a deterministic function of public hyperparameters, block indices, or other known values. Thus, any optimizer state needed for the update can be identically recomputed at the encoder and decoder without any side-channel communication.

By confining online learning to the adapter parameters 1862, 1872 within the adapter modules 1870, 1873—while keeping the large base network 1860 static—the system achieves a progressive specialization of its predictive distributions with bounded computation and memory requirements. Moreover, because all updates are deterministic functions of decoded data and shared hyperparameters, the encoder and decoder are guaranteed to obtain the same parameter values for the adapters after each block. This arrangement eliminates the need to transmit model deltas while maintaining strict reproducibility across different devices and computing platforms.

Accordingly, FIG. 6 demonstrates that adapter-only parameterization provides a practical mechanism by which the predictive model can adapt in lockstep at both encoder and decoder, thereby improving compression efficiency over time without sacrificing losslessness, determinism, or deployability.

FIG. 6 explicitly illustrates the update path 1890, which conveys gradient information and optimizer computations from loss 1850 to the adapter parameters 1862, 1872. The optimizer 1880 maintains an optimizer state 1884, which is derived entirely from public hyperparameters, block indices, or deterministic functions of past gradients. Because this state is derivable and does not rely on hidden variables, it can be replicated identically at encoder and decoder without transmission. The explicit depiction of update path 1890 and state 1884 emphasizes how reproducibility is preserved.

While FIG. 6 illustrates the use of adapter modules to confine updates to a small parameter subset, other embodiments may employ alternative strategies for defining the updatable subset $\Theta_u$. In one embodiment, only bias parameters of the predictive model are updated, leaving all weights of the main network fixed. This provides an especially lightweight update path that can still shift probability distributions in response to stream data. In another embodiment, only embedding vectors associated with tokenization are updated, enabling the system to learn new symbol associations or domain-specific vocabulary while maintaining the pretrained backbone. In yet another embodiment, only output scaling parameters, such as layer normalization coefficients or temperature factors, are adjusted to recalibrate distributions without modifying internal hidden states. These alternatives, individually or in combination, demonstrate that $\Theta_u$ may be defined flexibly according to implementation constraints, provided that the encoder and decoder apply identical deterministic updates under the same hyperparameters.

FIG. 7—Coding Efficiency Curves. Referring now to FIG. 7, there is shown a schematic plot comparing the average coding rate (expressed in bits per symbol) as a function of the amount of data processed by the system. The figure illustrates the performance difference between a static predictor and the lockstep adaptive compressor of the present invention.

The horizontal axis of FIG. 7 (labeled "Data Processed") represents the cumulative amount of input data that has been encoded and decoded. The vertical axis (labeled "Bits per Symbol") represents the empirical code length achieved by the compressor, averaged across all symbols processed up to that point. Although FIG. 7 is not drawn to scale, it qualitatively illustrates how the adaptive system reduces the average coding rate as it gains more experience with the data stream.

The dashed curve in FIG. 7 represents a baseline compression system in which the predictive model remains static during compression. In such a prior-art system, the encoder drives the entropy coder with probabilities generated by a fixed model whose parameters do not change. Because the predictor does not specialize to the statistics of the actual sequence, the average coding rate remains roughly constant over time (aside from minor fluctuations due to initial buffering or context buildup).

The solid curve in FIG. 7 represents the performance of the adaptive system disclosed herein. In this embodiment, after each block of data, the encoder and decoder both apply an identical deterministic update (such as update 1682 at the encoder and update 1782 at the decoder) to the restricted parameter subset $\Theta_u$ (for example, the adapter parameters 1562/1862 associated with the adapters). As more of the data stream is observed and processed, these updates cause the predictive model to become progressively better calibrated to that specific data source. Consequently, the entropy coder 1550 operates on increasingly accurate probability distributions, and the average number of bits required to encode each symbol decreases monotonically.

In many embodiments, the improvement in coding efficiency is most pronounced in the early portion of a data stream, where the lightweight adapters 1870 can rapidly specialize the model to the source distribution with modest amounts of data. Over time, the solid curve asymptotically approaches a lower steady-state rate determined by the cross-entropy of the adapted model on that source. The trajectory of the solid curve may vary depending on hyperparameters H (including block size 1600/1700, learning rate schedule, adapter rank or capacity, update frequency, etc.) as well as on the statistical characteristics of the source data. Nonetheless, the qualitative effect is consistent: the adaptive compressor eventually attains a strictly lower average coding rate than a static predictor under identical entropy coding conditions.

Thus, FIG. 7 illustrates the central benefit of the present inventions: by deterministically updating a shared predictive model at both encoder and decoder without transmitting model parameter deltas, the system continuously improves its compression efficiency over the course of a data stream, yielding lower average bits per symbol while still preserving strict losslessness and perfect reconstruction of the source data.

FIG. 7 may further include markers showing the effect of hyperparameters on compression trajectories. For instance, annotations may represent block sizes 1600/1700 or update stages 1682/1782 as points of inflection on the adaptive curve. These indicators clarify that coding efficiency is directly tied to the deterministic update cadence and the scope of adapter parameters being updated.

EXAMPLE EMBODIMENTS

Embodiment 1: High-Volume Database Replication

In one example embodiment, the system is deployed to compress a continuous stream of structured database records that are transmitted from a primary data center to a backup or subscriber site. Modern enterprise databases can contain hundreds of thousands of tables, but the majority of storage volume is often concentrated in a relatively small number of extremely large tables. Conventional compression methods (such as GZIP or 7-Zip) achieve only modest reductions in such data because they are limited to surface-level redundancies and cannot exploit deeper structural or semantic regularities in the records.

By contrast, in the present inventions, the encoder 1510 is located at the source application server, and the decoder 1520 is located at the remote subscriber. Both sides instantiate an identical predictive model 1560 initialized from a pretrained checkpoint. At the start of the replication session, the model already provides meaningful predictions for typical textual and tabular patterns, enabling the entropy coder to compress the data with some initial efficiency. As the stream progresses, the encoder processes blocks 1600 of database rows, entropy-encodes them using the model's predicted distributions 1552, and transmits compressed codewords 1554 to the subscriber site. After each block, the encoder applies deterministic updates 1682 to the adapter parameters 1562, and the decoder mirrors these with its own updates 1782. Because these updates are derived solely from data that the decoder has decoded and from shared hyperparameters, the predictive model at both ends remains synchronized at all times.

Over the course of a long-running replication session, the adapter parameters rapidly specialize the predictive model to the schema and value distributions of the transmitted tables. For example, if one database column contains many repeated customer identifiers, or if certain numeric fields follow predictable ranges, the model learns these patterns online. Consequently, the number of bits required to encode each record decreases steadily, as illustrated by the adaptive (solid) curve in FIG. 7. Unlike conventional compressors, which remain fixed in performance after initialization, the present systems continuously improve their compression efficiency throughout the stream. Periodic beacons 1590/1692/1794 embedded in the bitstream allow the systems to confirm synchronization between encoder and decoder; in the unlikely event of a discrepancy, the resynchronization procedures described above restore alignment. In this manner, terabytes of enterprise data can be replicated across wide-area networks with significantly reduced bandwidth requirements, all while preserving exact, lossless fidelity.

Embodiment 2: Industrial Robotics Sensor Data Compression

In another embodiment, the system is deployed in an industrial environment where autonomous mobile robots generate large volumes of sensor data. For example, consider a fleet of quadruped robots (such as those manufactured by Unitree Robotics) operating within a large factory. These robots are tasked with fetching specialized tools from a central repository and delivering them to workers throughout the facility. To ensure safety and efficiency, each robot is equipped with multiple high-resolution cameras, depth sensors (e.g. LiDAR), and other telemetry instruments. These sensors produce continuous streams of image, video, and spatial data that must be transmitted either to a local edge collector or directly to a centralized data center for monitoring and archival.

In this embodiment, each robot hosts an instance of the encoder 1510 capable of executing the predictive compression pipeline locally on the robot. The encoder applies the shared predictive model 1560, which has been pretrained on a broad corpus of visual and sensor data, to estimate symbol probabilities 1552 for image frames (for example, for patches of an image or quantized video codec latents). Using the entropy coder 1550, the encoder converts the sensor data streams into compressed codewords 1554, which are transmitted over a wireless channel 1530 as part of a bitstream 1535. A nearby edge collector or a central data center runs the corresponding decoder 1520, which entropy-decodes the incoming bitstream and applies the same deterministic updates 1782 to its local model instance after decoding each block.

Because both the robots and the collector/data-center are equipped with modern AI accelerators or GPUs, the system can afford to perform frequent model updates without impeding real-time operation. The update procedure is confined to the adapter parameters 1862/1872 (see FIG. 6), which ensures that the computational load remains manageable. Over time, the predictive model adapts to the specific visual and sensory environment of the factory: recurring patterns such as static backgrounds (walls, machinery, tool racks) and common movements become highly predictable, and the compression efficiency for the sensor streams steadily improves. In practice, the average bits per symbol required to encode video frames or other sensor readings decreases as the model learns the environment, enabling higher-resolution or higher-framerate data to be sent within the same bandwidth budget.

The use of periodic synchronization beacons 1590/1692/1794 in this scenario provides robustness against the wireless network's variability and potential packet loss. If interference or dropout occurs, any resulting model divergence is quickly detected by a beacon mismatch, and a resynchronization ensures that the encoder and decoder states remain aligned going forward. Importantly, no large-scale model transfers are required during operation-only the compressed sensor data and the occasional beacons traverse the wireless channel. Thus, even in a high-throughput, real-time robotics deployment, the system guarantees exact reconstruction of the sensor data at the collector, satisfying both safety monitoring requirements and data archival fidelity.

In another embodiment, the inventions are implemented as a computer program product comprising one or more non-transitory computer-readable storage media having computer-executable instructions stored thereon. When executed by one or more processors, the instructions cause the processors to perform the steps of the compression and decompression methods described herein. In particular, the instructions may implement the functions of receiving data blocks, generating probability distributions, entropy encoding and decoding, applying deterministic updates to the predictive model, inserting or verifying beacons, and initiating resynchronization procedures.

Such a computer program product may be distributed as a software library, standalone executable, firmware image, or integrated system component. The program may be provided via physical distribution media, such as optical discs or flash drives, or via network distribution, such as download from a cloud service. Because the inventions are designed to operate deterministically across heterogeneous computing platforms, the same computer program product can be deployed on CPUs, GPUs, FPGAs, or ASICs without divergence, ensuring consistent lockstep behavior between encoder and decoder.

ALTERNATIVE EMBODIMENTS

Although embodiments described herein emphasize updating adapter modules within a largely fixed predictive model, alternative configurations are possible. In one embodiment, the updatable parameter subset comprises only bias terms across selected layers of the predictive model, thereby enabling lightweight adaptation with minimal computational overhead. In another embodiment, the updatable parameters consist of embedding vectors associated with tokenization, allowing the system to adaptively learn domain-specific symbol relationships while keeping the backbone fixed.

In a further embodiment, the system adapts only output calibration factors, such as temperature parameters or normalization coefficients, to recalibrate probability distributions without altering internal hidden states. Still other embodiments may employ mixtures of the foregoing, permitting both embedding updates and bias adjustments. In yet another embodiment, a small convolutional sub-network is updated while surrounding Transformer layers remain frozen.

Alternative implementations of resynchronization may also be employed. Instead of transmitting delta patches, the encoder and decoder may periodically reset to the initial model state Go, ensuring bounded divergence. Other embodiments combine lightweight per-block checksums with less frequent deep model state hashes to achieve multi-layered assurance of synchronization.

These alternatives illustrate that the inventions are not limited to a single parameterization strategy, optimizer type, or beacon scheme, but rather encompasses any configuration in which the encoder and decoder apply identical deterministic updates under shared hyperparameters to maintain lockstep synchronization, for example.

The present inventions achieve technical advantages not realized by prior compression systems. Dictionary-based methods exploit repeated substrings or short contexts but are fundamentally limited to shallow redundancy. In contrast, in specific embodiments, the present inventions employ a foundation-scale predictive model capable of capturing semantic and long-range dependencies, thereby enabling improved compression efficiency on complex and heterogeneous data streams.

Statistical context models demonstrate lockstep adaptation but remain constrained to finite-order statistics. They cannot leverage high-capacity neural representations. By confining adaptation to lightweight adapter parameters (e.g., 1862/1872) within a frozen model (1860), in specific embodiments, the present inventions may extend the principle of synchronized adaptation to expressive neural architectures while preserving deterministic reproducibility.

Neural compression approaches employ large models but require side-information transfer-such as updated weights, latent codes, or hyperpriors-resulting in overhead and loss of strict synchrony. By contrast, in specific embodiments, the present inventions perform deterministic updates at both encoder and decoder without transmitting model parameters, so that model state may evolve identically at both ends based only on already transmitted data and shared hyperparameters.

Synchronization techniques address robustness but do not enable adaptive neural predictors. In specific embodiments, the present inventions may combine beacons (1590/1692/1794), error-control modules (1595), and reproducible optimizer state (1884/1890) with neural adaptation, resulting in both resilience to channel errors and strict lockstep determinism across heterogeneous hardware.

In specific embodiments, these distinctions demonstrate that the inventions are not a trivial extension of dictionary coding, statistical modeling, or neural compression with side information. Instead, it represents a non-obvious integration of expressive predictive models, deterministic lockstep updating, and synchronization protocols, yielding progressively lower bits-per-symbol coding rates while guaranteeing exact lossless reconstruction.

ALTERNATIVE APPLICATIONS

While certain embodiments have been described in the context of database replication, web transport, and industrial robotics, the inventions may also be applied in other domains where sequential data streams require efficient lossless compression. In one embodiment, the system is deployed in blockchain and distributed ledger technologies, where transaction logs are continuously appended and must be stored and transmitted efficiently across a network of nodes. Lockstep adaptive compression reduces bandwidth requirements while preserving verifiability of transaction records.

In another embodiment, the system is integrated into secure messaging platforms. Because encoder and decoder states evolve deterministically without transmitting model updates, synchronization can be maintained even in encrypted channels without exposing sensitive model information. This provides improved compression efficiency for encrypted chat logs or archival of secure communications.

In yet another embodiment, the inventions are applied to virtual reality (VR) and augmented reality (AR) streaming, where high-rate sensor and rendering data are transmitted to client devices. By progressively adapting to environmental patterns or repeated textures, the system reduces average transmission cost while ensuring exact reconstruction.

Further embodiments include scientific archiving of simulation data, real-time financial tick feeds, and satellite telemetry, each benefiting from the inventions' ability to adaptively compress streams over long horizons without side-information overhead. These alternative applications confirm that the inventions are broadly applicable beyond the specifically illustrated use cases.

BEST MODE

In a best-mode embodiment, the predictive model is a Transformer architecture pretrained on a mixed corpus of text, binary records, and sensor streams. Adapter modules are inserted into each encoder and decoder block and updated by stochastic gradient descent with a fixed learning rate of 0.001, block size of 1024 tokens, and gradient clipping at norm 1.0. Synchronization beacons are inserted at every one megabyte of compressed output, each beacon comprising a 64-bit truncated SHA-256 hash of the adapter parameters. This configuration has been demonstrated to yield reproducible lockstep adaptation across CPU, GPU, and FPGA platforms, while reducing average bits per symbol by up to twenty percent relative to static predictors.

OBJECTS OF THE INVENTIONS

In a specific embodiment, it may be an object of the present inventions to provide a system and method for lossless data compression that improves coding efficiency as a function of stream length, while guaranteeing exact reconstruction of the original data. A further object of the invention may be to enable deterministic and lockstep adaptation of a predictive model at both the encoder and the decoder without transmitting any model parameters or weight updates. Another object may be to confine online training to a restricted subset of model parameters, such as adapter modules, so that adaptation can be performed with minimal computational overhead and in a reproducible manner across heterogeneous hardware platforms. Still another object of the inventions may be to integrate synchronization beacons and resynchronization procedures into the compression protocol, thereby ensuring robustness to channel errors or nondeterministic divergences. Additional objects of the inventions may include supporting diverse real-world applications, such as database replication, robotics, and sensor data streaming, by providing a scalable and fault-tolerant compression solution that reduces bandwidth and storage requirements while maintaining strict losslessness.

Prior works in adaptive neural compression have not solved the problem of maintaining synchronized adaptation between encoder and decoder without transmitting updated model parameters. Certain systems disclose encoder-only adaptation of neural networks, in which the encoder retrains on input data while the decoder remains static. Such approaches yield improved predictions at the encoder but do not provide a mechanism for keeping the decoder in lockstep, thereby precluding strictly lossless reconstruction. Other methods adapt generative models on a per-instance basis and then transmit the updated parameters or latent codes to the decoder. These systems incur substantial overhead by sending side-information and cannot operate efficiently in continuous streaming scenarios. General-purpose neural compressors such as DZip employ static models with arithmetic coding, but do not adapt model parameters at all during compression.

Traditional adaptive entropy coding schemes, such as context-adaptive binary arithmetic coding (CABAC), Prediction by Partial Matching (PPM), and context mixing, maintain synchronized states between encoder and decoder by updating simple probability tables or context counts. While these systems demonstrate lockstep adaptation, they are fundamentally limited by the expressiveness of their models, which are constrained to finite-context statistics and lack the capacity of large-scale neural architectures.

By contrast, the present inventions achieve synchronized, online adaptation of a high-capacity predictive model by restricting updates to a deterministic subset of parameters, such as adapter modules. Both encoder and decoder apply identical update rules based only on already-transmitted data and shared hyperparameters, ensuring that model state evolves in perfect synchrony without transmitting weight updates or side-information. This combination of expressive neural predictors with deterministic, lockstep synchronization and integrated beacon-based verification is not disclosed or suggested by prior approaches, and constitutes a novel and non-obvious advance in the field of lossless compression.

SUMMARY OF ADVANTAGES

The present inventions achieve advantages not realized by prior systems. In specific embodiments, by updating a predictive model in lockstep at the encoder and decoder, the inventions may yield progressively improved compression performance relative to static predictors, thereby lowering average bits per symbol over time. Because model updates are confined to adapter modules and applied deterministically, the presents inventions may guarantee identical evolution of encoder and decoder states across platforms and implementations, ensuring hardware-agnostic reproducibility. In specific embodiments, the inclusion of synchronization beacons and resynchronization procedures may provide resilience to transmission errors, allowing recovery from mismatches without retransmitting entire model states. In specific embodiments, the modular architecture may permit parallel operation of multiple compressors and decompressors, making the system suitable for high-throughput environments. In specific embodiments, these advantages demonstrate that the inventions are not only technically novel but also practically superior, such as for industrial deployment, offering efficiency, robustness, and scalability in a unified lossless compression framework.

In specific embodiments, the present inventions may provide several advantages that distinguish them from prior compression systems and demonstrate their practical utility. In specific embodiments, by applying deterministic updates to a shared predictive model at both encoder and decoder, the present inventions may achieve progressive improvements in compression efficiency over the course of a data stream, reducing average bits per symbol relative to static predictors. In specific embodiments, because adaptation is confined to a restricted subset of model parameters, the present inventions may guarantee reproducibility across heterogeneous hardware platforms and avoid the instability of full-model retraining.

In specific embodiments, synchronization beacons and resynchronization procedures may be integrated directly into the compression protocol, providing robustness to channel noise, packet loss, or nondeterministic divergence. Unlike prior neural compressors, in specific embodiments, the present inventions may avoid the need for transmission of updated weights, latent codes, or hyperparameters, thereby eliminating the side-information overhead that previously limited online adaptation in a lossless setting. In specific embodiments, the modular architecture may further permit parallelization across multiple compressor and decompressor instances, enabling deployment in high-throughput environments such as cloud data centers and content delivery networks.

In specific embodiments, these advantages illustrate that the present inventions not only represent novel technical approaches but may also deliver practical benefits of efficiency, robustness, and scalability that are absent from existing compression technologies.

EXEMPLARY PROCEDURES (PSEUDOCODE)

To further illustrate a specific embodiment of the inventions, the following pseudocode provides an exemplary implementation of the encoder and decoder pipelines, highlighting deterministic updates and beacon synchronization:

```
Encoder
state Θ ← Θ₀
for block b in stream:
    probs ← model_predict(x_block, Θ)
    code ← entropy_encode(x_block, probs)
    send(code)
    Θ ← update(Θ, x_block, probs, H) # deterministic
    if b % N == 0: send(beacon(Θ))
Decoder
state Θ ← Θ₀
for block b in stream:
    x_block ← entropy_decode(code_b, model_predict(·, Θ))
    Θ ← update(Θ, x_block, model_predict(x_block, Θ), H)
    if b % N == 0: verify(beacon, Θ)
    else: continue
```

The pseudocode emphasizes that both encoder and decoder begin from the same initial model state $\Theta_o$, process identical blocks, and apply identical deterministic update rules using public hyperparameters H. Synchronization beacons inserted every N blocks confirm alignment of encoder and decoder state, and resynchronization procedures can be triggered if a mismatch is detected.

INDUSTRIAL APPLICABILITY

In specific embodiments, the inventions may be applicable to high-volume database replication, distributed file storage, cloud backup, industrial robotics telemetry, IoT sensor networks, and real-time streaming of video or sensor data. In each case, large sequential data streams are transmitted or archived with reduced bandwidth or storage requirements while guaranteeing exact reconstruction, thereby providing significant operational and economic benefits In specific embodiments, the inventions may have wide applicability across industries that generate, transmit, or archive large sequential data streams. In cloud computing environments, the present inventions may be deployed as a replacement for existing compression libraries such as GZIP or Zstandard, thereby reducing storage and bandwidth consumption across distributed systems. In content delivery networks (CDNs), adaptive lockstep compression can be integrated into HTTP or TLS pipelines, allowing high-volume web traffic to be compressed more efficiently without breaking protocol compatibility.

In database management and replication, the inventions may enable efficient synchronization of primary and backup sites, with progressive adaptation to schema-specific redundancies, reducing network costs for enterprise systems. In industrial robotics and IoT deployments, including fleets of quadruped robots and factory sensors, the inventions may allow continuous telemetry and video streams to be compressed deterministically and reconstructed exactly at edge collectors or central data centers.

In addition, the inventions may be applicable to scientific computing, genomic sequencing, satellite imaging, and financial data feeds, where extremely large streams must be retained with full fidelity. By reducing average coding rates while guaranteeing exact reconstruction, the invention provides tangible economic and operational advantages across diverse industries, confirming its broad industrial applicability.

EXAMPLES

Example 1 (Byte-level): A 300 M-parameter Transformer with rank-8 adapters updates every 2 KiB using stochastic gradient descent with initial learning rate $\eta_0$=1e-3, gradient clipping at 0.5, and rANS entropy coding. Over a 1 GB log stream with recurring templates, the bits-per-byte decreases from 1.85 to 1.32 after 1600 MB.

Example 2 (Text): A subword model updates only layer normalization biases and output temperature parameters. Periodic beacons inserted every 128 KB enable immediate detection of desynchronization between encoder and decoder.

Example 3 (Resynchronization Patch): On beacon mismatch, the encoder transmits a 4-16 KB compressed delta patch for the adapter parameter subset Ou, restoring synchronization within one block without requiring full retransmission of the model state.

SCOPE OF THE INVENTIONS

The foregoing description of embodiments of the inventions has been presented for purposes of illustration and description. It is not intended to be exhaustive or to limit the inventions to the precise form disclosed. Modifications and variations will be apparent to those of ordinary skill in the art in light of the above teachings.

For example, while embodiments have been described in the context of predictive models based on Transformer architectures, other architectures such as recurrent neural networks, convolutional models, or hybrid statistical-neural frameworks may also be used, provided that encoder and decoder apply identical deterministic updates under shared hyperparameters. Similarly, while adapter modules, bias parameters, or embeddings have been described as the updatable parameter subsets, other restricted parameterizations may be substituted without departing from the principles of the inventions.

The terminology used herein was chosen to best explain the principles of the inventions, their practical application, and to enable others of ordinary skill in the art to understand the inventions for various embodiments with suitable modifications. The scope of the inventions is defined by the appended claims, and all equivalents are intended to be embraced therein.

It is to be understood that the inventions disclosed herein are not limited to the exact details of construction, operation, exact materials or embodiments shown and described. Although specific embodiments of the inventions have been described, various modifications, alterations, alternative constructions, and equivalents are also encompassed within the scope of the inventions. Although the present inventions may have been described using a particular series of steps, it should be apparent to those skilled in the art that the scope of the present inventions is not limited to the described series of steps. The specification and drawings are, accordingly, to be regarded in an illustrative rather than a restrictive sense. It will be evident that additions, subtractions, deletions, and other modifications and changes may be made thereunto without departing from the broader spirit and scope of the inventions as set forth in the claims set forth below. Accordingly, the inventions are therefore to be limited only by the scope of the appended claims. None of the claim language should be interpreted pursuant to 35 U.S.C. 112(f) unless the word "means" is recited in any of the claim language, and then only with respect to any recited "means" limitation.

The invention claimed is:

1. A method of lossless data compression comprising:
  receiving, by an encoder, an input block of symbols from a data stream;
  generating, by a predictive model comprising a frozen base model and an updatable parameter subset, probability distributions for symbols of the input block;
  entropy encoding, by an entropy coder, the input block into a codeword using the probability distributions;
  transmitting the codeword as part of a compressed bitstream over a channel to a decoder;
  updating, by the encoder, the updatable parameter subset according to a deterministic update rule using the input block as training data;
  decoding, by the decoder, the compressed bitstream using the predictive model to reconstruct the input block by entropy decoding; and
  updating, by the decoder, the updatable parameter subset according to the same deterministic update rule using the reconstructed block, wherein synchronization between encoder and decoder is maintained without transmission of model parameters.

2. The method of claim 1, wherein the updatable parameter subset comprises adapter modules inserted into a largely frozen neural network.

3. The method of claim 1, wherein the deterministic update rule is executed by an optimizer whose state is derivable from public hyperparameters, block indices, and observed data.

4. The method of claim 1, further comprising inserting, by the encoder, periodic synchronization beacons into the compressed bitstream, each beacon encoding a compact representation of the updated model state, and verifying, by the decoder, each beacon against a locally computed value.

5. The method of claim 4, further comprising initiating a resynchronization procedure upon detecting a beacon mismatch, the resynchronization procedure comprising one of: rolling back the predictive model to a previously verified state or applying a corrective delta transmitted from the encoder.

6. The method of claim 1, wherein the entropy coder is selected from the group consisting of arithmetic coding, range coding, rANS coding, and table-based tANS coding, and wherein coding precision and renormalization parameters are fixed to ensure reproducibility.

7. The method of claim 1, wherein numerical determinism is enforced by constraining computation kernels, fixing random number generator seeds, and applying explicit rounding rules such that identical inputs and hyperparameters yield identical outputs at encoder and decoder across different platforms.

8. The method of claim 1, wherein the compressed bitstream further comprises integrity metadata including per-block checksums or forward error correction information.

9. The method of claim 1, wherein tokenization of the input block is modality-specific and selected from the group consisting of byte-level tokenization, subword tokenization, image patch tokenization, quantized residual tokenization, and audio latent representation.

10. The method of claim 1, wherein the predictive model is initialized from a pretrained checkpoint and is progressively specialized to the input stream through successive deterministic updates, thereby reducing average coding rate in bits per symbol over time.

11. A system for lossless data compression comprising:
  an encoder including a predictive model with an updatable parameter subset and an entropy coder, the encoder configured to encode input data into a compressed bitstream and to apply deterministic updates to the updatable parameter subset;
  a decoder including a corresponding predictive model and an entropy decoding module, the decoder configured to decode the compressed bitstream and to apply identical deterministic updates to the updatable parameter subset; and
  a synchronization mechanism comprising beacon signals and optional resynchronization procedures, whereby the encoder and decoder remain in lockstep without transmission of model parameters.

12. The system of claim 11, wherein the encoder further comprises a dispatcher configured to distribute data packets to multiple compressor processes each associated with a distinct predictive model, and a transmitter configured to select compressed outputs from the compressor processes and transmit them together with compression metadata.

13. The system of claim 11, wherein the decoder comprises multiple decompressor processes configured to reconstruct data packets using predictive models corresponding to the models used by the encoder.

14. The system of claim 11, wherein the predictive model includes adapter modules with updatable parameters updated deterministically via an optimizer along an update path, with optimizer state derivable from public hyperparameters.

15. The system of claim 11, wherein the system is configured to reduce average bits-per-symbol coding rate as more data is processed, yielding an adaptive coding efficiency trajectory lower than that of a static predictor.

16. The system of claim 11, wherein the synchronization mechanism further comprises validation modules that compare received beacon values against historical parameter states.

17. The method of claim 1, further comprising applying auxiliary processes for model fine-tuning during long-running streams, wherein fine-tuned models replace original models after synchronization with the decoder.

18. The system of claim 11, wherein auxiliary processes provide redundancy or load balancing across multiple compressor or decompressor modules.

19. The method of claim 1, wherein error-control modules are integrated into the pipeline to perform checksum verification, forward error correction, or adaptive buffering during compression and decompression.

20. The system of claim 11, wherein best-mode operation comprises implementing the predictive model as a Transformer architecture pretrained on a mixed corpus of text and binary data, updating adapter modules with a stochastic gradient descent optimizer using a fixed learning rate and predetermined block size.

\* \* \* \* \*